United States Patent [19]

Roberts et al.

[11] Patent Number: 4,676,993

[45] Date of Patent: Jun. 30, 1987

[54] METHOD AND APPARATUS FOR SELECTIVELY FINE-TUNING A COUPLED-DUAL RESONATOR CRYSTAL AND CRYSTAL MANUFACTURED THEREBY

[75] Inventors: Gerald E. Roberts, Lynchburg; Samuel Toliver, Rustburg; Robert J. Crescenzi, Forest, all of Va.

[73] Assignee: General Electric Company, Schenectady, N.Y.

[21] Appl. No.: 851,910

[22] Filed: Apr. 11, 1986

Related U.S. Application Data

[62] Division of Ser. No. 676,125, Nov. 29, 1984, abandoned.

[51] Int. Cl.[4] .................... H04R 17/00; C23C 16/00
[52] U.S. Cl. ..................................... 427/10; 29/25.35; 427/100
[58] Field of Search ............... 427/8, 10, 100; 29/25.35; 310/312; 324/56

[56] References Cited

U.S. PATENT DOCUMENTS

| | | | |
|---|---|---|---|
| 2,432,950 | 12/1947 | Turner et al. | 91/12.2 |
| 2,571,167 | 10/1951 | Ruggles et al. | 118/505 |
| 2,765,765 | 10/1956 | Bigler et al. | 29/25.35 |
| 2,906,235 | 9/1959 | Hirsh | 310/312 |
| 2,978,364 | 4/1961 | Blaustein | 117/227 |
| 3,063,867 | 11/1962 | Emery | 117/93 |
| 3,117,025 | 1/1964 | Learn et al. | 118/49 |
| 3,352,282 | 11/1967 | Schweitzer | 118/49 |
| 3,371,138 | 2/1968 | Zablocki | 264/134 |
| 3,502,051 | 3/1970 | Adams | 118/11 |
| 3,504,325 | 3/1970 | Rairden | 338/160 |
| 3,549,414 | 12/1970 | Curran et al. | 427/100 |
| 3,573,672 | 4/1971 | Fair et al. | 310/312 |
| 3,600,675 | 8/1971 | Grenier | 324/56 |
| 3,670,693 | 6/1972 | Rorick et al. | 118/715 |
| 3,756,851 | 9/1973 | Rennick et al. | 427/10 |
| 3,773,541 | 11/1973 | Ng | 117/33.3 |
| 3,866,155 | 2/1975 | Kobayashi et al. | 333/72 |
| 3,963,982 | 6/1976 | Roberts | 324/56 |
| 3,992,760 | 11/1976 | Roberts | 29/25.35 |
| 4,093,914 | 6/1978 | Peppiatt et al. | 333/191 |
| 4,107,349 | 8/1978 | Vig | 29/25.35 |
| 4,112,134 | 9/1978 | Buynak et al. | 427/10 |
| 4,112,147 | 9/1978 | Thompson | 427/10 |
| 4,323,031 | 4/1982 | Kaplan | 118/720 |
| 4,343,827 | 8/1982 | Thompson | 427/10 |
| 4,378,382 | 3/1983 | Behn | 427/9 |
| 4,391,034 | 7/1983 | Stuby | 29/579 |

Primary Examiner—John H. Newsome
Attorney, Agent, or Firm—Robert C. Lampe, Jr.

[57] ABSTRACT

A dual-coupled resonator crystal is fine-tuned by frequency balancing the input and output resonators and thereafter plating a coupling adjust spot on the grounded side shadowing the unelectroded region of the front side of the crystal to produce a change in synchronous peak separation frequency. Thereafter, the front side electrodes are sequentially plated to bring plateback and synchronous peak separation frequency to their target values. Interim adjustments in synchronous peak separation frequency may be made during the tuning process to compensate for misalignment of the plating elements.

22 Claims, 17 Drawing Figures

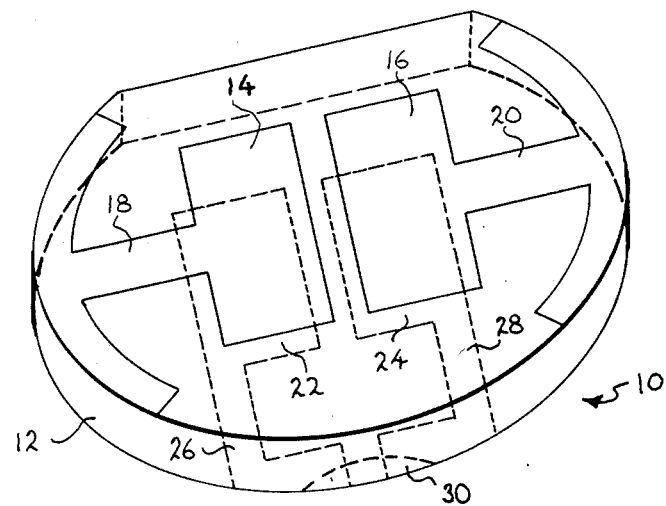
FIG.1
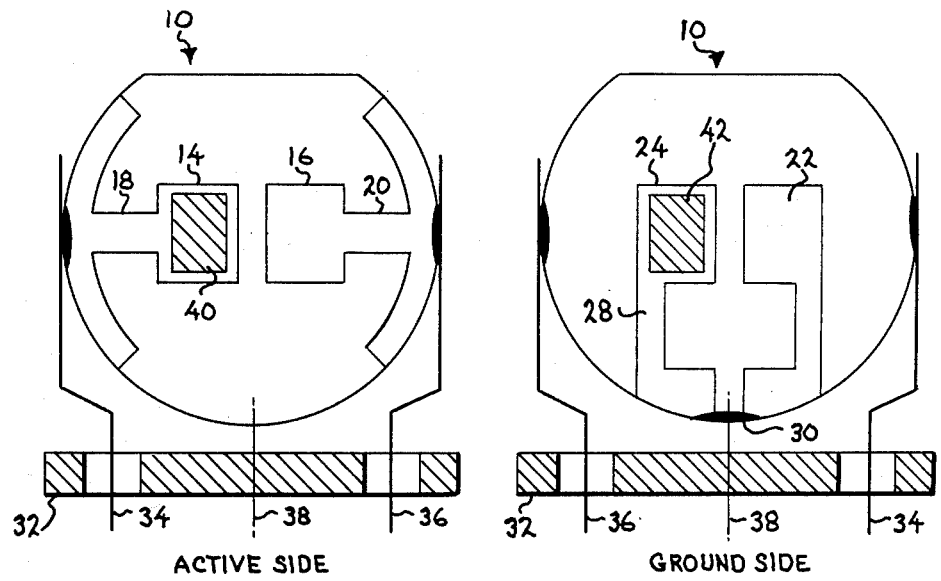
ACTIVE SIDE
FIG.2A
GROUND SIDE
FIG.2B

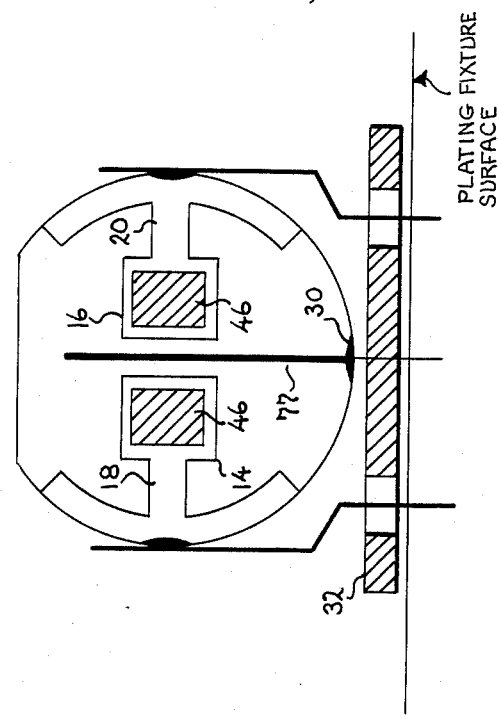
FIG.10B
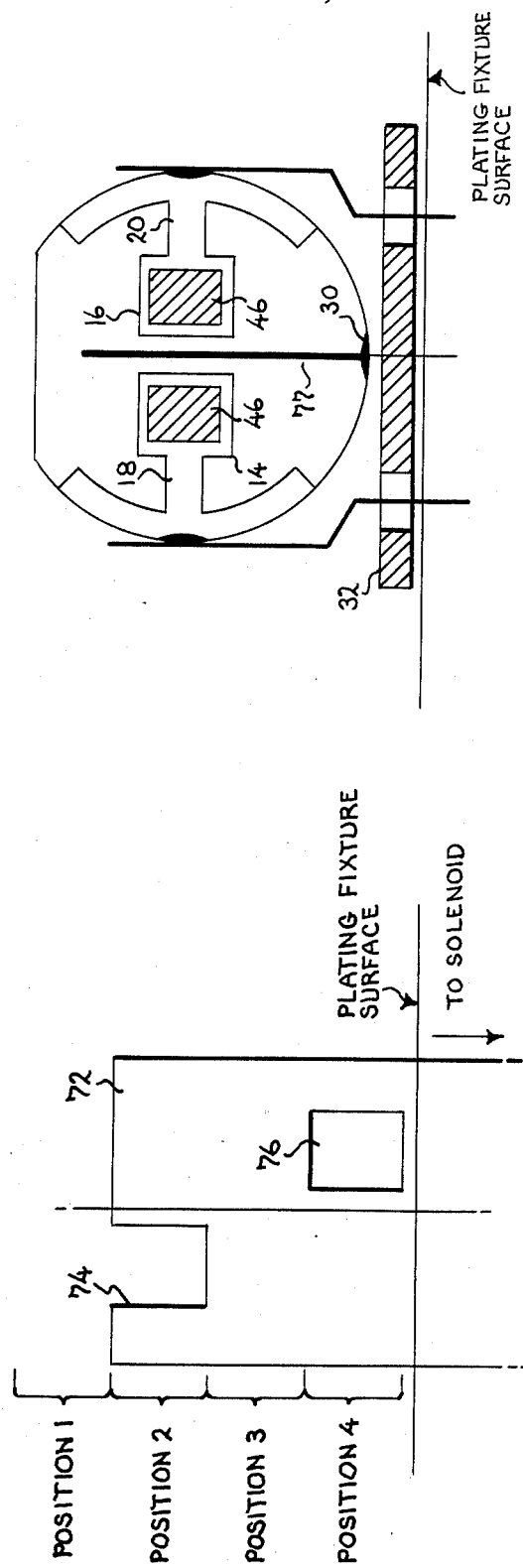
FIG.10A
| SHUTTER POSITION | SHUTTER APERTURES | | DECIMAL VALUE | PLATING ACTION |
|---|---|---|---|---|
| | LEFT | RIGHT | | |
| 1 | 1 | 1 | 3 | PLATE BOTH RESONATORS |
| 2 | 1 | 0 | 2 | PLATE A-RESONATOR |
| 3 | 0 | 0 | 0 | STOP PLATING |
| 4 | 0 | 1 | 1 | PLATE B-RESONATOR |
APERTURE STATUS
0 - CLOSED
1 - OPEN
FIG.10C

| SHUTTER POSITION | 1ST SHUTTER | | 2ND SHUTTER | COMPOSITE | | DECIMAL VALUE | PLATING ACTION |
|---|---|---|---|---|---|---|---|
| | LEFT | RIGHT | | A RESONATOR | B RESONATOR | | |
| 1 | 1 | 0 | 1 | 1 | 0 | 2 | PLATE A-RESONATOR |
| 2 | 0 | 1 | 1 | 0 | 1 | 1 | PLATE B-RESONATOR |
| 3 | X | X | 0 | 0 | 0 | 0 | STOP PLATING |

APERTURE STATUS
0 = CLOSED
1 = OPEN
X = DOESN'T MATTER

FIG. 12B

METHOD AND APPARATUS FOR SELECTIVELY FINE-TUNING A COUPLED-DUAL RESONATOR CRYSTAL AND CRYSTAL MANUFACTURED THEREBY

This is a division of application Ser. No. 676,125, filed Nov. 29, 1984, now abandoned.

BACKGROUND OF THE INVENTION

Our invention relates to a method and apparatus for fine tuning a coupled-dual resonator crystal and, more particularly, for selectively controlling the two resonator frequencies and the coupling between the resonators of a coupled-resonator crystal.

Crystal filters are used extensively in radio and electronic circuits. Dual or two-resonator crystal filters are preferred in many applications because they provide the characteristics of a very narrow bandpass filter or part of a very narrow filter, due to the extremely high Q of the associated resonator crystals, in a relatively small size. Such very narrow filter characteristics are virtually impossible or extremely difficult to realize with lumped devices, such as inductors or capacitors.

A typical dual resonator crystal filter includes a wafer of piezoelectric material having two or more pairs of electrodes formed on the wafer. The mass loading of each pair of electrodes (one on each side forming a resonator) determines in part the resonant frequency of that resonator. Coupling between the pair of electrodes forming the input resonator and the pair of electrodes forming the output resonator is determined in part by the effective separation between the resonators. A coupling strip may be positioned on one face of the piezoelectric material between the input and output electrodes to reduce the effective separation and thus increase coupling.

The three major characteristics of the coupled-dual crystal which are controllable during its fabrication process and which are primary determinants of the filtering characteristics of the corresponding filter are the resonator frequencies of the input and output resonators and the synchronous peak separation frequency (SPSF). Synchronous peak separation frequency is a measure of coupling and has been defined in U.S. Pat. No. 4,093,914, which is assigned to the same assignee as the present invention and incorporated herein by reference, as the absolute value of the difference between the two short circuit resonant frequencies that would occur if the two resonators were tuned to the same resonant frequency.

As taught by U.S. Pat. No. 4,093,914, the significance of synchronous peak separation frequency is that it can provide a common reference value at a particular point in the process of tuning a specific crystal for evaluating the acoustic coupling of that crystal. It has meaning in that it represents a value or number which can be related mathematically to the coupling capacitor in the equivalent circuit of the crystal. It also provides a convenient measure of a specific crystal's coupling capability, as related to the nominal design, independent of the actual variations in resonator frequencies of the crystal. The value of the synchronous peak separation frequency is that it provides a means for controlling or monitoring the fabrication of crystals of a specific coupled-dual crystal design by mathematically relating the acoustic coupling of each crystal to standard or common conditions. It represents, in essence, a "coupling parameter" which can be used and calculated at any point in the fabrication process regardless of whether or not the two resonators are equal in frequency. It can be distinguished from the filter resonator coupling of Thompson (U.S. Pat. No. 4,343,827) which is associated with balanced open circuit resonant frequencies. By using synchronous peak separation frequency instead of Thompson's filter resonator coupling, we have a coupling parameter which we can use anywhere in the tuning process regardless of whether or not the resonator frequencies are equal. Thus, we use synchronous peak separation frequency in our process and, as used hereinafter, the terms "resonator coupling", "coupling parameter" and "coupling" refer to synchronous peak separation frequency (or SPSF).

The prior art teaches that coupling and the center or mean frequency (the arithmetic mean of the two resonator frequencies) can be adjusted or "tuned" by adding mass to the electrodes of the resonators to decrease their respective frequencies. However, because a change in mass loading of the electrodes simultaneously varies both parameters, the final frequency adjustment of SPSF and mean frequency becomes difficult.

Several techniques have been developed in the past in an attempt to efficiently accomplish this fine-tuning of crystal filters. One such technique for fine-tuning monolithic crystal filters is disclosed in the aforementioned U.S. Pat. No. 4,343,827 in which additional mass is deposited on just one side of the crystal wafer. First, additional electrode material is plated on one half of a solid electrode (on the grounded side) to balance the open circuit resonator resonant frequencies of the filter. Additional electrode material is then plated on the entire solid electrode through a plate mask larger than the entire ground side electrode to fine-tune the midband frequency to its final desired value. The difficulty with this system is that the platings tend to overlap the conductor pattern to cause changes in inductance because no mask is actually indexed off of or fits over the crystal. Also implicit in this patent is a frequency monitoring technique which is slow and likely to be inaccurate in that it monitors amplitude via an oscilloscope to balance the frequencies of the resonators, which is a limitation in itself.

J. L. Hokanson has suggested (in "Laser Machining Thin Film Electrode Arrays on Quartz Crystal Substrates", 23rd Annual Symposium on Frequency Control, May 1969) a technique for adjusting coupling via a coupling stripe between electrodes using a laser for machining off material. In addition, the resonator frequencies are adjusted using laser machining of the resonator electrodes. This same technique is proposed by Watanabe and Tsukamoto in a somewhat more refined manner (see "High-Performance Monolithic Crystal Filters with Stripe Electrodes", Electron. Commun. Japan, Vol. 57 part A, pp. 53–60). One problem with these techniques is the relatively high cost of the laser equipment necessary to implement them.

Another problem is that even with prior art frequency tuning systems, the method and apparatus for controlling the amount of plating on the various components have proven inadequate. Typically, the resonators are plated in a vacuum chamber in which a piece of metal, such as high purity silver, is vaporized and deposited on the resonator electrodes. Control of the location and duration of the plating is critical. In the typical system, the resonators are masked to expose only the portion of the resonator to be plated, thus fixing the location of the plating. As for the duration, in some systems the amount of deposition is controlled simply by controlling the amount of plating metal vaporized via control of the current through the filament on which the metal is melted and from which the metal is evaporated. This is generally inadequate for the fine-tuning required in many applications because it is difficult to stop the vaporization process at precisely the right moment to insure the desired frequency in the plated resonator. This is because of the tendency of the vaporization apparatus to overrun 45-MR-469 slightly when its control circuits are turned off.

There are several other known ways to control the plating process. One approach is to vary the deposition rate from an initial high rate to a lower rate as the resonator frequency approaches the target frequency. Such an approach is taught in U.S. Pat. No. 3,670,693, by Rorick et al. Another approach is to interject a shutter system between the vaporization source and the object to be plated to abruptly terminate the plating process such as taught by U.S. Pat. No. 2,432,950, Turner et al. Yet another approach is to abruptly release the vacuum and inject an inert gas into the vaporization chamber as taught in U.S. Pat. No. 4,112,134 to Buynak et al). The shutter system seems to be the most easily controllable, but previous systems suffered from mechanical complexity within the vacuum apparatus. This is compounded when multiple elements are to be plated through multiple masks requiring multiple shutters. This requires the use of elaborate control systems.

SUMMARY OF THE INVENTION

Accordingly, it is the object of the present invention to provide a new and improved method of fine-tuning a monolithic crystal filter.

It is another object of the present invention to provide a new and improved method for setting a predetermined synchronous peak separation frequency and mean frequency for a coupled-dual resonator crystal.

It is yet another object of the present invention to provide new and novel apparatus for controlling the plating of electrode material during the fine-tuning of coupled-dual resonator crystals These, and other objects and advantages, will be more clearly understood from the following detailed descriptions, the drawings and specific examples, all of which are intended to be typical of, rather than in any way limiting on, the scope of the present invention.

Briefly stated, the above objectives are attained with a dual-coupled resonator crystal by frequency balancing the input and output resonators and thereafter plating a coupling adjust spot on the grounded side shadowing the unelectroded region of the front side of the crystal to produce a predetermined change in synchronous peak separation frequency. Thereafter, the resonator electrodes on the front side are sequentially plated through a plating mask using an ON-OFF shutter system to simultaneously adjust plateback and synchronous peak separation frequency of the resonators to their objective values. If necessary, interim adjustments in SPSF are made to compensate for mask misalignment and/or the relationship of plateback vs. change in SPSF as the resonators are plated to their final values.

BRIEF DESCRIPTION OF THE DRAWINGS

While the specification concludes with claims particularly pointing out and distinctly claiming the subject matter which is regarded as part of the present invention, it is believed that the invention will be more fully understood from the following description of the preferred embodiments which are given by way of example with the accompanying drawings in which:

FIG. 1 is a simplified perspective view of a coupled-dual resonator crystal;

FIGS. 2A and 2B depict in schematic form both sides of a mounted coupled-dual resonator crystal;

FIGS. 10A, 10B and 10C depict schematically a binary shutter system, a crystal with which it is used and the associated truth table, respectively;

FIG. 12B is the truth table associated with FIG. 12A; and

DESCRIPTION OF THE PREFERRED EMBODIMENT

Figure 3:
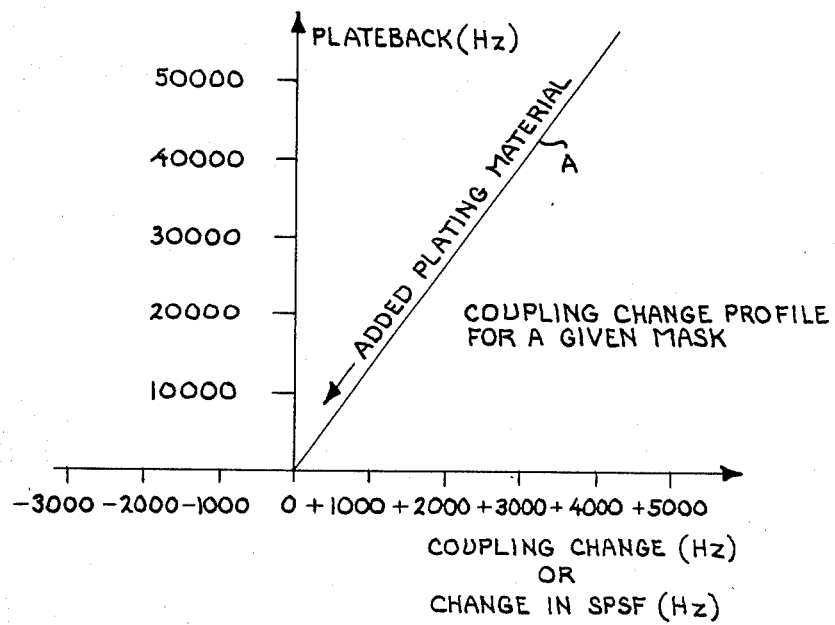
FIG. 3 represents graphically the generally linear relationship between plateback and coupling change for a particular plate mask.

Referring to the drawings wherein like numerals correspond to like elements throughout, attention is first directed to FIG. 1 wherein a coupled-dual resonator crystal filter 10 of the type intended for use with our invention is shown. The filter 10 is formed on a wafer 12 of piezoelectric material such as quartz. A metallic input electrode 14 and an output electrode 16 are applied to the upper or active surface of wafer 12, and electrical connections for these electrodes are provided by leads 18, 20, respectively. Similarly, another input electrode 22 and another output electrode 24 are applied to the lower or grounded surface of wafer 12, with leads 26, 28 providing electric connections therefor. Typically, leads 26, 28 are shorted together as at 30. Opposed input electrodes 14, 22 form an input resonator, whereas opposed output electrodes 16, 24 form an output resonator. Alternating current signals applied to leads 18, 26 cause the piezoelectric material in the input resonator to mechanically vibrate, which vibrations are transmitted to the output resonator, producing voltages which can be derived at leads 20, 28. The piezoelectric material has resonant properties such that only a narrow band of signals is passed between the input leads 18, 26 and the output leads 20, 28. As is well known, the resonant frequency of each of the resonators is determined in part by the mass loading of the material comprising the electrodes, and the shape of the passband is determined in part by the number of resonators. The degree of coupling between the input and output resonators varies as an inverse function of the separation between the input and output electrodes. This effective separation can be decreased (to increase the coupling) by the placement of a coupling strip (not shown) of metal between the electrodes on one side of the wafer as is well known in the art.

As depicted in FIG. 1, electrodes 22, 24 on the grounded side are split. However, in other embodiments the gap between electrodes may be omitted so that, in essence, only one electrode appears on the grounded side. That portion opposite electrode 14 cooperates with electrode 14 to comprise the input resonator and the portion opposite electrode 16 cooperates with electrode 16 to comprise the output resonator. Such a configuration is within the scope of the present invention.

One of the most critical operations in the fabrication of a coupled-dual crystal is the final fine-tuning adjustment to put the resonators on the correct frequency and to put the synchronous peak separation frequency on its correct final frequency. The final frequency plating is typically performed in some type of frequency plating machine having a fixture within a vacuum chamber with the crystal being plated under vacuum and with the plating being electronically controlled external to the vacuum chamber. In this regard, see U.S. Pat. No. 3,670,693 to Rorick et al and U.S. Pat. No. 4,112,134 to Buynak et al for examples of vacuum deposition apparatus. One prior art method of electronic monitoring of the resonator frequencies and SPSF as the plating is selectively deposited onto each resonator is given in U.S. Pat. No. 4,093,914 referenced above. Initially, the coupled-dual resonator crystal is mounted on a crystal base 32 as depicted in FIG. 2. The crystal base is provided with thin wire leads which make contact with the electrode leads, enabling electrical connection to other apparatus. In particular, base lead 34 connects with input electrode lead 18, base lead 36 connects with output electrode lead 20, and base lead 38 connects with shorted electrode leads 26, 28 at 30. Initially, the mounted coupled-dual crystal 10 is inserted into the vacuum fixture making electrical contact between the crystal and an electrical test fixture allowing monitoring of specific crystal parameters during the plating operation.

The material for plating typically comes from high purity silver, gold or aluminum wires suspended upon filament wires running generally parallel to each face of wafer 12 as will be discussed in greater detail later. A precision, non-conducting mask is hung over the wafer exposing all or part of one electrode of each electrode pair forming the input and output resonators. Heretofore, one electrode of each resonator was exposed, the two exposed electrodes being on opposite sides of the wafer. After the vacuum chamber was evacuated, power was applied to the filament via a filament power supply, causing the deposition material, here silver wire, to evaporate onto the unmasked portions of each face of the wafer where frequency plate spots 40, 42 are deposited, thereby increasing electrode mass. The speed at which the silver evaporates was controlled in part by the filament power supply. A shutter system exposes the opening in the mask to plate an electrode as the silver metal on the filament is evaporating.

Figure 4:
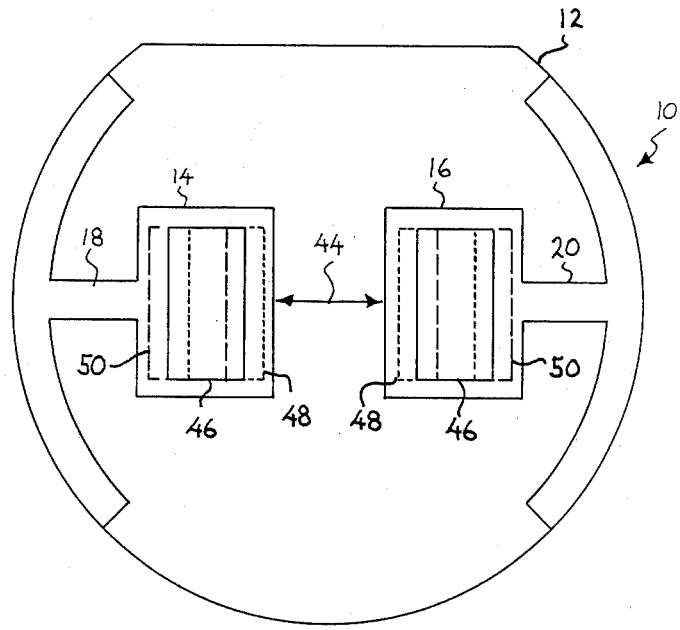
FIG. 4 is a front view of a resonator crystal showing several locations for the frequency plate spots.

We have discovered that not only does the amount of deposited material on the electrodes affect the tuning of the resonator, but the position or location of the added material has an effect as well. In particular, we have discovered that a given mask which positions frequency plate spots at certain points on the wafer produces its own intrinsic change in coupling (SPSF) as a function of plateback. Plateback is defined as the change in center frequency of the resonators (i.e., the difference between the mean frequency measured at any time in the plating process and the desired final mean frequency) as the crystal is plated to its final frequency. This is illustrated in FIG. 3 in which plateback for a particular mask and particular frequency spot locations is plotted against coupling change (or change in synchronous peak separation frequency) as material is plated on both electrodes 14, 24 of the wafer of FIG. 2. As shown in FIG. 3, the relationship between plateback and coupling change represented by line A is a generally linear one. Said another way, mean frequency and SPSF are reduced in a linear relationship as material is plated on the electrodes. If the frequency plate spots are positioned close to the unelectroded region between resonators, the slope of line A is steeper than when the frequency plate spots are positioned further away from the unelectroded region. For example, referring now to FIGS. 4 and 5, a typical wafer 12 having plated resonator electrodes 14, 16 is separated by an unelectroded region denoted generally as 44. In this example, as a pair of frequency plate spots 46 are plated on the same side of the wafer, the corresponding relationship between plateback and coupling change is represented as line B on FIG. 5. As the location of the frequency plate spots are moved closer to the unelectroded region 44 (for example, plate spots 48) the slope of line B tends to become steeper, similar to that represented by line C. Conversely, if the frequency plate spots were located as at 50, the slope would decrease as represented by line D. Thus, a family of curves is possible for a family of masks which vary the location of the frequency plate spots. It is possible that, when the spots are sufficiently close, the slope of the relationship becomes negative as represented by curves E or F in FIG. 5.

Figure 5:
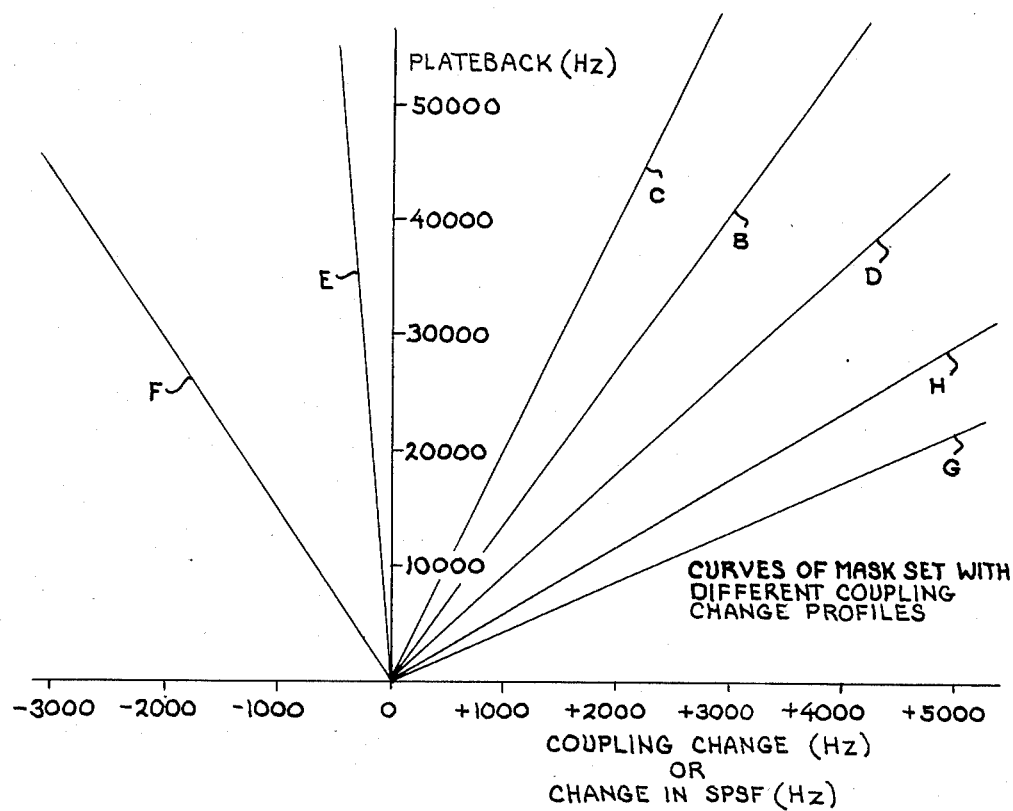
FIG. 5 is similar to FIG. 3 for a plurality of plate masks.

Ideally, if a set of masks whose coupling change profiles are such as in FIG. 5 for a given crystal is used, the final frequency-adjusted crystals would be very close to the required final coupling if the initial coordinates (i.e., before final frequency adjust) were known and if the mask with the closest coupling change profile was chosen to final frequency-adjust the specific crystal.

We have further discovered that the frequency plate spots can both be on the same side of the crystal, or one spot may be on the front side electrode of one resonator and the ground side electrode of the other resonator. Both arrangements produce similar coupling change curves. We have also discovered that if either or both frequency plate spots is off the original baseplated resonator electrodes, spurious amplitudes are increased dramatically. Therefore, the masks associated with, for example, curves F and G (FIG. 5) must produce spots completely on the crystal resonator electrodes for best results.

Figure 6:
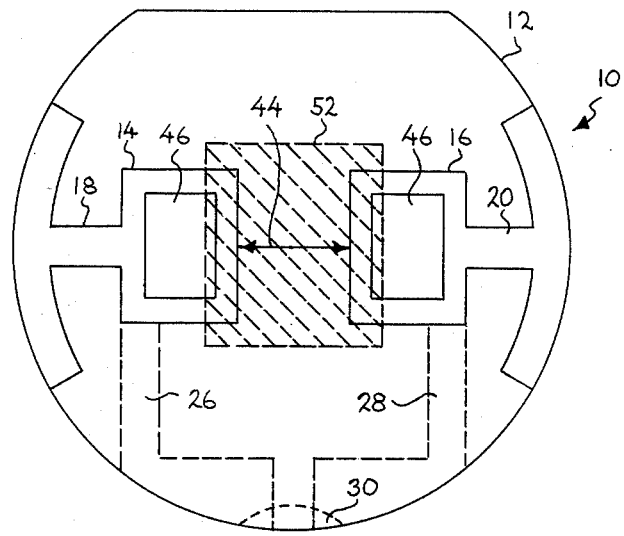
FIG. 6 is similar to FIG. 4 showing the addition of a coupling adjust spot on the ground side.

In addition, we have discovered that, by making the frequency plate mask such that both frequency adjust spots are on the front or active side of the wafer, we can position a mask opening to deposit a spot (usually rectangular) on the opposite side of the mask to adjust the value of coupling (SPSF). As is best shown in FIG. 6, this mask opening allows a coupling adjust spot 52 to be deposited on the ground side of the crystal, but shadowing the unelectroded region 44 on the active side of the crystal. The coupling adjust spot overlaps the two ground side electrodes in a split electrode configuration or just the single electrode when it is not split. In addition, the coupling adjust spot should be vertically larger than the vertical dimension of the resonators. We have also found that it should shadow the resonator electrodes 14, 16 on the active side by approximately half the unelectroded region's horizontal distance 44 and preferably also overlap each frequency adjust spot 46 on the active side by 1 to 5 mils. In actuality, the determination of overlap (or shadow) distances is based on the resulting spurious levels and is done empirically, but the distances previously recited are representative of crystals we have fine-tuned using this approach.

Figure 7:
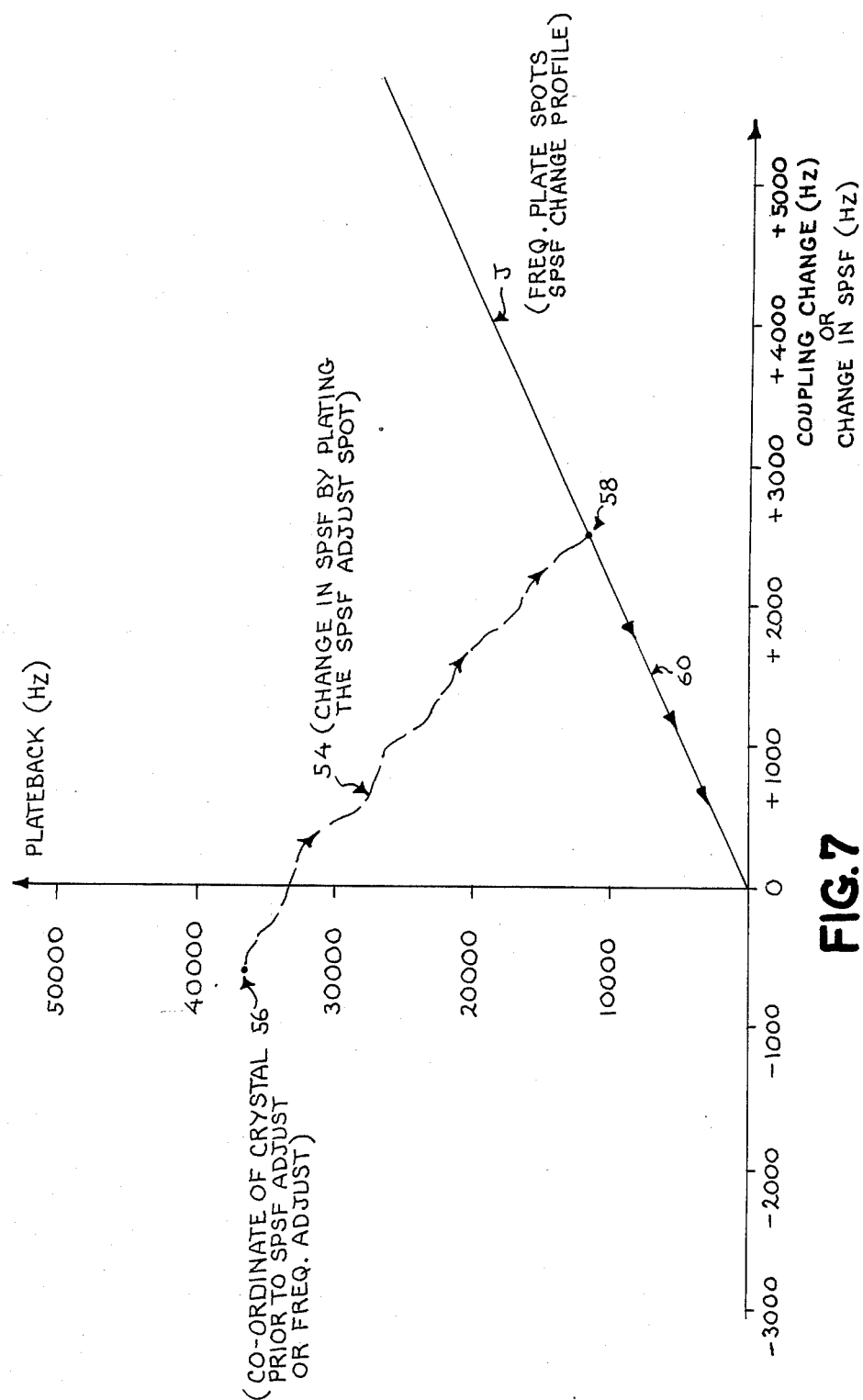
FIG. 7 is similar to FIG. 3 showing graphically the additional effect of the coupling adjust spot on coupling.

We have also discovered that a coupling (SPSF) adjust spot of metallic or other material used alone on the ground side (i.e., without frequency plate spots on the front or active side) will produce a curve with a negative slope relative to its pre-final frequency adjust coordinates if plotted on FIG. 5. Thus, if the coupling profiles of a series of masks were known, such as profiles B-H of FIG. 5, then a coupling adjust spot could be plated on the ground side, with material being added until the coordinates intersected a predetermined coupling profile line. Thereafter, the frequency plate spots could be deposited upon the electrodes until the desired final frequency was obtained. This composite plating operation can be shown graphically by the broken path 54 indicated by arrowheads in FIG. 7. Therein, the frequency coordinates of the crystal prior to final frequency adjust are at 56. Curve 54 represents the change in coordinates caused by plating of a coupling adjust spot such as spot 52 of FIG. 6. When curve 54 intersects a predetermined coupling profile line J, representative of a particular mask, at point 58, plating of the coupling adjust spot is terminated and plating of the frequency plate spots is initiated. The coordinates follow path 60 as material is deposited until the desired frequencies are obtained at the origin.

Figure 8:
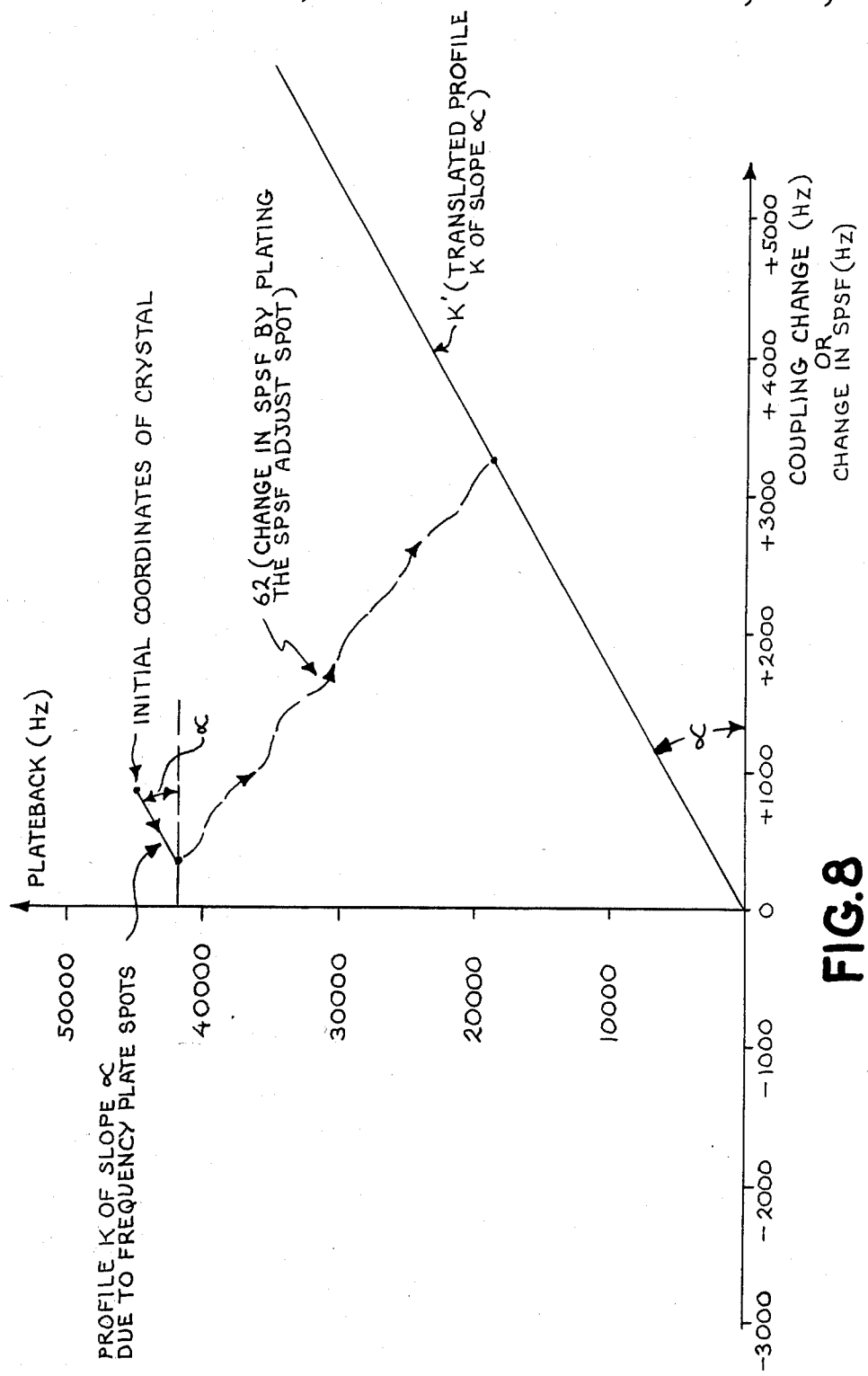
FIG. 8 is similar to FIG. 7 showing graphically an alternative approach to final frequency tuning.

Since the coupling profile of a particular mask's frequency plate spots can change depending on how the mask is placed on the crystal, a fixed predetermined coupling profile of the frequency plate spots often cannot be predicted exactly or close enough to produce the required coupling. However, we discovered that we can determine the dynamic coupling profile of the frequency plate spots for any mask and mask location by frequency adjusting the resonators first, prior to plating the coupling adjust spot. Referring to FIG. 8, by first plating the frequency plate spots with only a thin film of material through a mask which we empirically believe to be acceptable, we can determine the slope $\alpha$ of the resulting coupling profile curve K, translate it such that it goes through the origin of the graph, then adjust the coupling using the coupling adjust spot so that the coordinates follow path 62 to the translated curve K', and thereafter finish plating the frequency plate spots such that the coordinates pass through the origin which represents the final or target frequencies.

Figure 9:
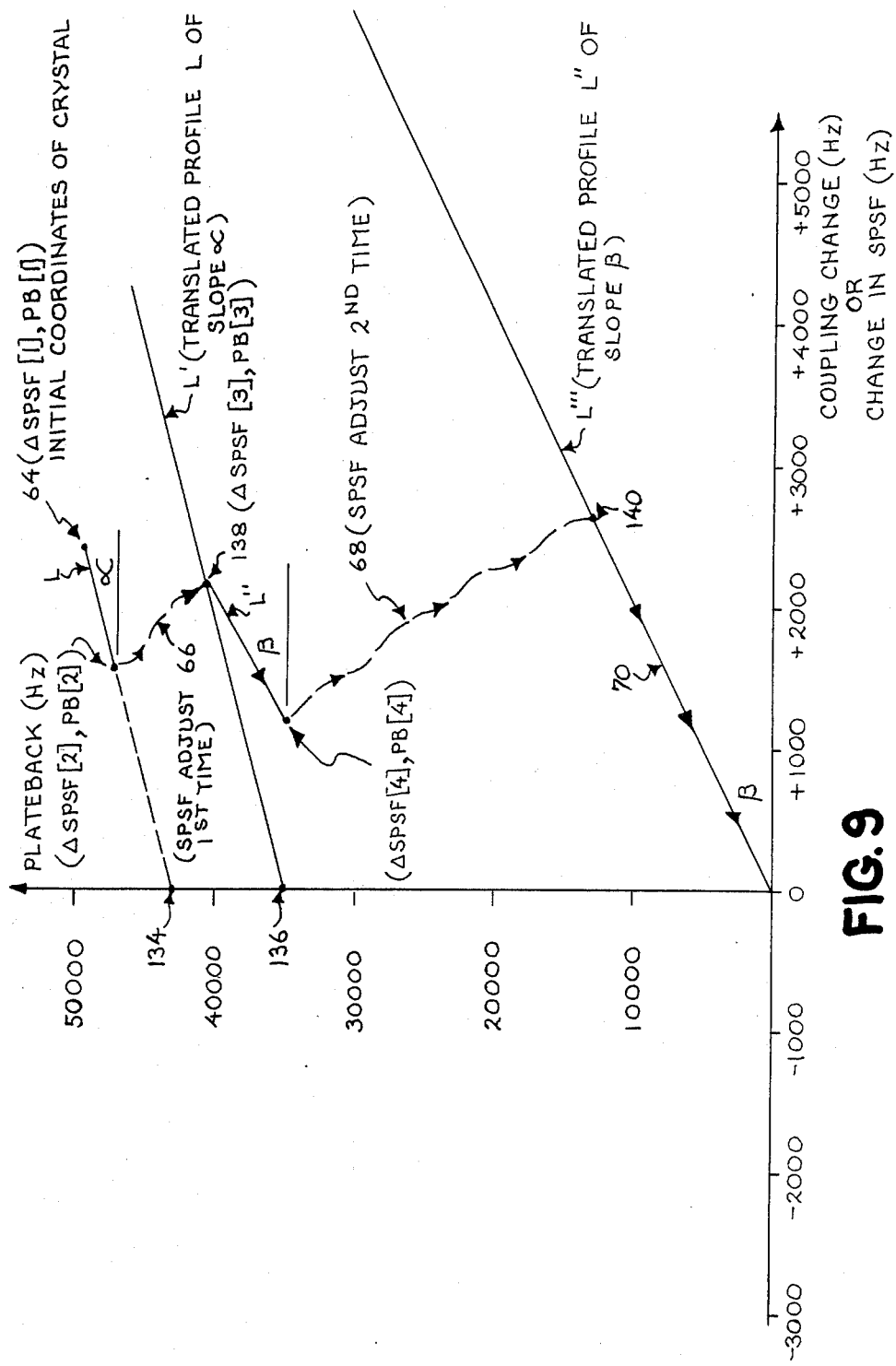
FIG. 9 is similar to FIG. 8 in which the final frequency tuning is accomplished in several steps.

We have also found that the mask position is sometimes disturbed during the plating process, thus changing the plateback vs. coupling change slope, so it may be desirable to initially translate the coupling profile line only part of the way to the origin. Then the slope can be recalculated when the crystal frequency coordinates reach the line. This may be repeated any convenient number of times based on the particular design and specific plating conditions in order to assure that the value of SPSF reaches the required value at final frequency. This is represented by FIG. 9 wherein the dynamic coupling profile L of the frequency plate spots for a crystal having initial coordinates at 64 is first shown to have a slope $\alpha$. Profile L is translated only part of the way to the origin and, when through use of the coupling adjust spot, the coordinates following line 66 reach the translated profile L', another sampling of the dynamic coupling profile is made. This time, due to unintentional slippage or movement of the mask, the profile (now L") assumes a slope of $\beta$. Thereafter, through continued plating of the coupling adjust spot, the coordinates following line 68 reach the translated profile L''' of profile L". Thereafter, the frequency plate spots are further plated such that the coordinates follow profile L''' along path 70 to the origin and the desired final frequencies.

As has already been mentioned, the frequency plate spots are plated onto the resonator electrodes through the open or exposed portion of a frequency plate mask. The mask is made of a non-conducting material and slides over the crystal wafer exposing portions of the resonator electrodes. In the past, shutter systems have been proposed which selectively expose the opening in the mask to the plating metal as it evaporates from its filament. We will now describe an improved shutter system which we have found particularly useful when used in combination with the frequency adjust method just described.

Basically, a shutter is a thin flat piece of metal attached to the plunger of a linear solenoid. When mounted in a typical plating fixture, it moves between two positions; one position in which it blocks the opening in the mask and another position in which it exposes the opening in the mask. The mask openings are typically circles or rectangles. As previously discussed, a particular mask has associated therewith a particular, generally linear, relationship between plateback and change in SPSF when applied to a particular location on a particular crystal. Theoretically, this allows the crystal frequency to be fine-tuned to the desired SPSF as the resonators are plated. In actuality, however, precise tuning is difficult to obtain with prior art systems because of tolerances in the wafer, the crystal base (element 32 of FIG. 2) and the masks themselves.

An available alternative method for plating crystal resonators uses a frequency plate mask on the front side of a crystal with an opening exposing each resonator electrode, and another mask with an opening exposing a coupling strip between the electrodes on the grounded side. Each resonator electrode is plated from two separate filament located in front of each electrode. A partition separates the two filaments from each other and extends to the front face of the wafer allowing each filament to plate only onto the electrode immediately in front of it. A third filament on the opposite (grounded) side of the crystal is used to plate onto the coupling strip. The power to each of the three filaments is turned on and off and adjusted in intensity to plate on the desired amount of metal. This system uses no shutters and is inadequate because of the tendency of the filaments to remain hot enough for the metal to continue to evaporate after the power is turned off.

Figure 11:
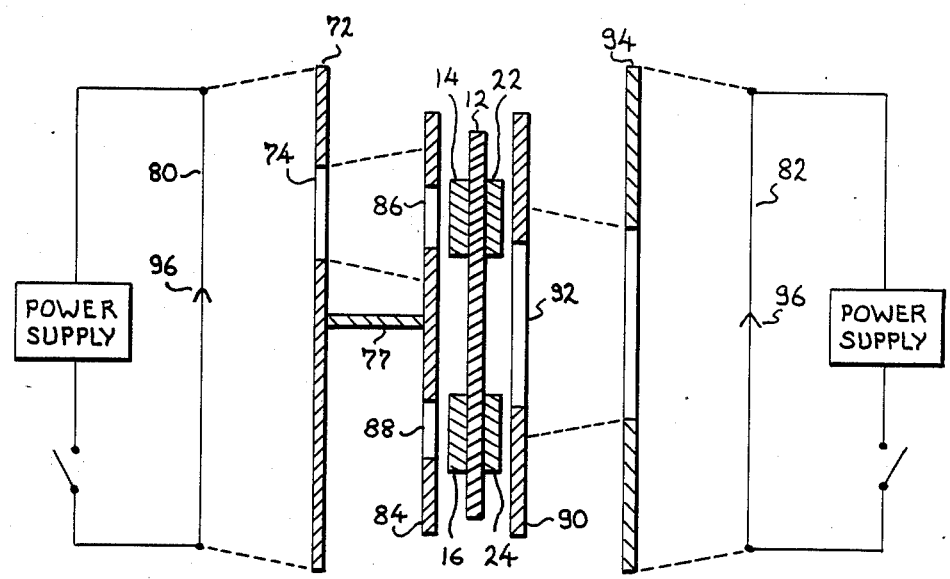
FIG. 11 is a schematic representation of a coupled dual resonator being plated using a binary shutter system.

We prefer an ON-OFF shutter system between a single filament and two openings in the frequency plate mask. This allows exposure of either or both openings during plating, as well as completely shutting off the deposition of metal when the desired frequency is obtained. A four-position shutter 72 is depicted in FIGS. 10A and 11, the shutter comprising a thin sheet of metal having generally rectangular openings 74, 76 therein. As shown, the openings are rectangular but may assume any other shape such as circular. The shutter is used in conjunction with the plating of a crystal wafer such as that depicted in FIG. 6 and which is reproduced in simplified form as FIG. 10B. Openings 74, 76 in the shutter are separated laterally and vertically such that they can expose their respective frequency electrodes 14, 16 only when in one of four positions. When the four position shutter is in position 1, it exposes both of the electrodes. As shown, in position 1 the shutter has been retracted sufficiently through the plating fixture surface so that neither resonator is blocked. This could also be accomplished with two laterally displaced rectangular openings in a vertically upward extension of shutter 72. Partition 77 extends from the frequency plating mask 84 to shutter 72 to prevent material passing through aperture 74 from being inadvertently deposited on the other resonator. When the shutter is in position 2 in front of the frequency plate mask openings, only one electrode (14) can be plated. In position 3, neither electrode can be plated because there are no apertures in the shutter associated with this vertical displacement. Finally, when the shutter is in position 4 in front of the frequency plate mask openings, only the other electrode 16 can be plated. A truth table for this shutter arrangement is shown in FIG. 10C, with resonator A being the one associated with electrode 14 and resonator B being associated with electrode 16. A key feature of this arrangement is that only one binary digit and only one opening is changed when the shutter sequences from one position to another. This provides for relatively easy electronic monitoring.

FIG. 11 is a schematic representation of the plating system when viewed from above. This configuration provides for the plating of not only the frequency plate spots on the front or active side of the crystal, but also the previously discussed coupling adjust spot on the reverse or grounded side. A pair of filaments 80, 82 are disposed with one on each side of piezoelectric wafer 12. The wafer is provided with the usual electrodes 14, 22 forming an input resonator and electrodes 16, 24 forming an output resonator. Frequency plate mask 84 of nonconductive sheet material masks electrodes 14, 16 for the purpose of forming the frequency plate spots thereon through apertures 86, 88, respectively. Similarly, mask 90 is provided to form the coupling adjust spot through aperture 92. Between filament 80 and mask 84 is binary shutter 72 with its apertures 74, 76, only one of which is depicted because in this example the shutter is positioned such that only electrode 14 is exposed. Similarly, another shutter 94 is disposed between filament 82 and mask 90 to control the disposition of material through mask 90. Each filament is connected to a power supply which, when activated, causes material such as high grade silver elements 96 suspended on the filaments to evaporate into droplets which are propelled in all directions including toward wafer 12. It is recognized that other vaporizable materials could be used. If shutters 72 and 94 have their respective apertures aligned with their respective mask openings, some silver droplets (determined by the duration and magnitude of the power flow through the filaments) will be deposited on the electrodes and/or wafer surfaces to form the frequency plate spots and/or coupling adjust spot. In practice, we have found that good results are obtained when the masks are positioned within 1 to 4 mils of the wafer, the shutters are disposed 250 to 1000 mils from the masks and the filaments are 200 to 500 mils from the shutters.

The operation of shutter 72 working in conjunction with two-position shutter 94 allows the functional adjustment of frequency and coupling (SPSF) in a dynamic 45-MR-469 mode as earlier described. Accordingly, mask 84 would be one of the set of masks producing profiles of the type illustrated in FIG. 5. The fact that both resonators can be plated simultaneously, or one resonator can be plated at a time, or both resonators can be completely masked out allows for extremely accurate frequency and coupling adjustment. Heretofore, available systems only permitted the adjustment of two of the three parameters comprising resonator A frequency, resonator B frequency or coupling. The present arrangement permits the selective adjustment of all three parameters.

The specific system which we prefer in a four-peak plater (reference U.S. Pat. No. 4,093,914) for a 44,970 KHz coupled-resonator crystal is a 3-position, 2 shutter system represented in FIG. 12A. Basically, a modified shutter 100 with only positions 2 and 4 from FIG. 10A is used to plate one resonator or the other. Between it and the filament 80 a second shutter 102 is positioned having a single aperture 103 which comprises an ON-OFF shutter, namely, positions 1 and 3 from FIG. 10A. This dual-shutter arrangement permits the plating of each resonator and even quicker cut-off of deposition, although at the expense of some small added system complexity. This arrangement has the particular advantage of assuring appropriate time for the search routine used in monitoring the crystal during plating. A truth table showing the operation of shutters 100 and 102 appears in FIG. 12B.

Alternative embodiments of the shutter systems described herein are disclosed in copending patent application Ser. No. 676,124 filed concurrent herewith and assigned to the same assignee as the present invention, the subject matter of which is incorporated herein by reference.

Figure 13:
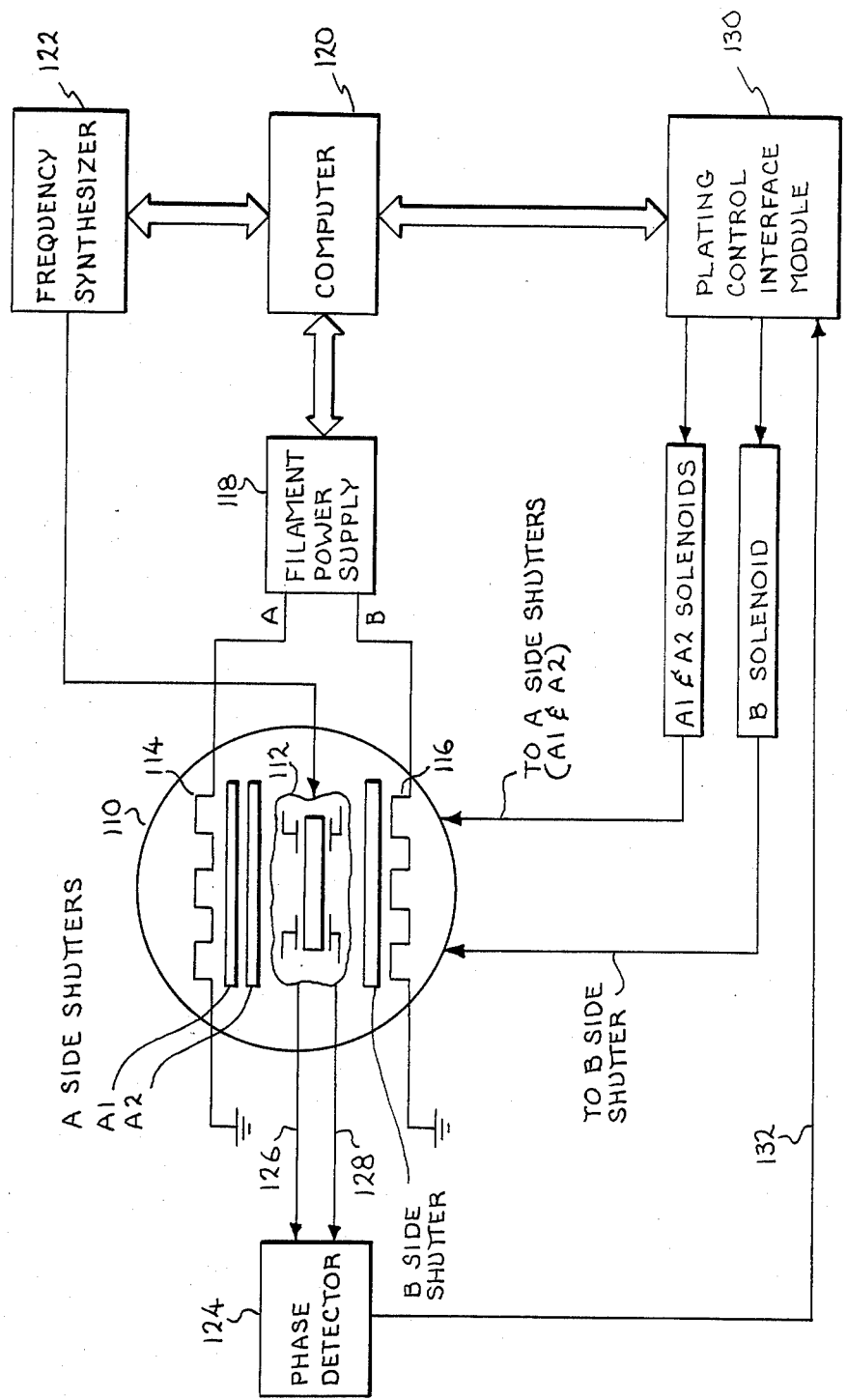
FIG. 13 is a schematic representation of apparatus for carrying out the present invention.

We shall now describe our preferred system for carrying out our novel method for fine-tuning coupled-dual resonator crystals using the binary shutter system, with particular reference to FIGS. 9 and 13. The following discussion shall consider the tuning of a coupled-dual resonator crystal of the type previously described.

Figure 12A:
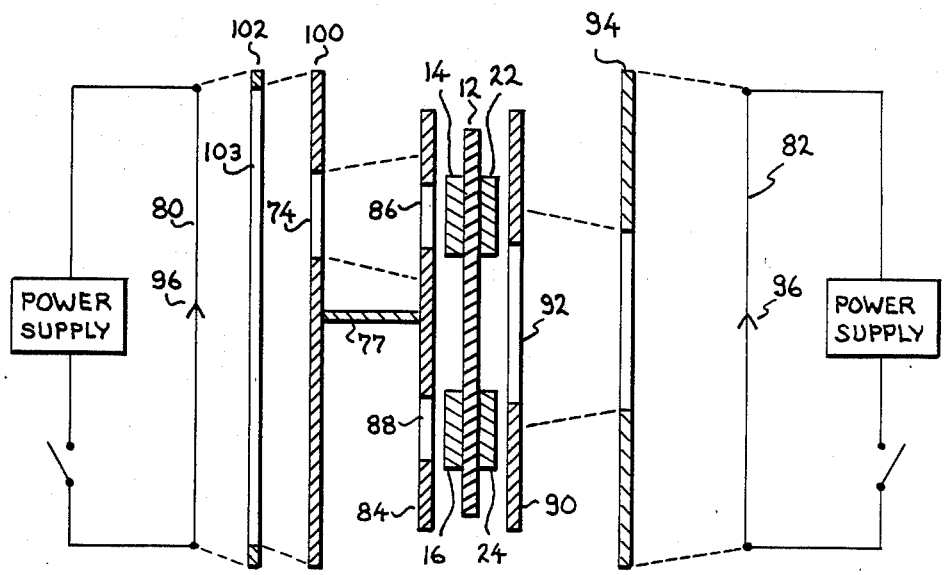
FIG. 12A is similar to FIG. 11 utilizing an alternative binary shutter system.

Referring now to FIG. 13, a test fixture 110 is schematically illustrated. This test fixture is of the well known vacuum chamber type having disposed within the chamber a dual-coupled resonator crystal 112 having an input resonator and output resonator of the type previously described. A pair of filaments 114, 116 provide the sources for plating the active (A-side) and ground (B-side) sides of the dual-coupled resonator crystal, respectively, whereas shutter apparatus comprising A-side shutter (A1 and A2) control the amount of plating on the input and output resonators, respectively, in the manner previously described while the B-side shutter controls the plating of the coupling spot on the ground side. The arrangement of resonators, shutters, filaments and masks (not shown in FIG. 13) is similar to that depicted in greater detail in FIG. 12A. For purposes of this example, shutters 102, 100 and filament 80 of FIG. 12A are equivalent to shutters A1, A2 and filament 114 of FIG. 13, respectively, whereas their counterpart shutter 94 and filament 82 on the ground side are designated as shutter B and filament 116, respectively.

Filaments 114 and 116 are connected to a filament power supply 118 which can selectively power either or both filaments as instructed by computer 120. The resonators are connected to the electrical circuit of FIG. 2 of U.S. Pat. No. 4,093,914 which is capable of measuring the critical parameters of the coupled-dual resonator crystal. Frequency synthesizer 122 generates variable input frequencies to the input resonator as instructed by computer 120. Phase detector 124 senses the four output frequencies F1, F2, F3 and F4 from the output resonator through connection 126 as well as a reference voltage signal from the frequency synthesizer input to the crystal through connection 128. F1 and F3 correspond to the short-circuit voltage amplitude peaks of the transfer function and F2 and F4 correspond to the open-circuit voltage amplitude peaks shown in FIGS. 3a and 3b of U.S. Pat. No. 4,093,914. We have found it more convenient to utilize the phase response of the transfer function because it is easier to measure the phase cross-over point than to measure a voltage amplitude peak. Thus F1 and F3 also correspond to the cross-over points (plus to minus) of a response plot which represents the phase response of the transfer function of the circuit of FIG. 2 of U.S. Pat. No. 4,093,914. These phase cross-over points can be readily obtained using the phase detector 124 in the known manner.

Plating control interface module 130 interfaces between computer 120, phase detector 124 and plating fixture 110. It controls A1 and A2 solenoids which actuate the A side shutters A1 and A2, and B solenoid which activates the B side shutter in response to signals received from computer 120 based on information received from phase detector 124 via connection 132. The shutters operate in the manner previously described.

Typically, when processing a large number of resonator crystals of the same type, a set of starting parameters is available based on the particular crystal design or obtained empirically for that particular crystal type. These parameters are stored in computer 120 and represent:

L[1]=target frequency for the input resonator
L[2]=target frequency for the output resonator
L[3]=target SPSF After the crystal 112 has been placed in the vacuum chamber of fixture 110 and the appropriate frequency plate masks have been properly placed over both sides of the crystal, the vacuum chamber is closed and pumps start pulling a vacuum. As the vacuum is being pulled, the crystal is measured using the four-frequency method of U.S. Pat. No. 4,093,914 with frequency synthesizer 122 providing the input frequencies. The four frequencies F1, F2, F3 and F4 may be obtained by monitoring the phase of the output frequency responses of the transfer-function with phase detector 124 recognizing that the positive to negative zero crossings in a phase response plot as frequency increases correspond to F1 and F3 for the closed circuit (switch S1 closed in FIG. 2 of U.S. Pat. No. 4,093,914) and F2 and F4 for the open circuit (switch S1 open, putting C8 across the output B and ground terminals). A large number of search routines can be programmed into computer 120 to find the initial four zero crossings, including the Interval Halving Method, the Secant Method; the Muller Method and the Newton-Raphsen Method.

From the initial values of F1, D2, F3 and F4, initial values of the input resonator frequency (FA[1]), the output resonator frequency (FB[1]) and SPSF (SPSF[1]) can be calculated using the formulae of Pat. No. 4,093,914. This establishes the initial coordinates of the crystal as:

$$\text{Plateback } (PB[1]) = \frac{FA[1] + FB[1]}{2} - \frac{L[1] + L[2]}{2}$$

Change in SPSF ($\Delta$SPSF[1])=SPSF[1]−L[3]The coordinates ($\Delta$SPSF[1], PB[1]) are designated on FIG. 9 at point 64.

Next, the relationship between FA and FB is determined. When one of these two frequencies is substantially different from the other, the amplitude of the responses at F1 and F3, as well as at F2 and F4, are also substantially different. For a given difference in frequencies of FA and FB, and for a given SPSF, the difference in amplitude at F1 and F3, as well as at F2 and F4, will depend on the specific crystal design as well as the value of the crystal resonator Q's, the values of the equivalent static capacitances of the two resonators and the value of the capacitance in the measurement fixture 110 (C1, C3 and C8 of FIG. 2, U.S. Pat. No. 4,093,914). Typically, if the input resonator is driven by the synthesizer 122 and FA is lower in frequency than FB, then the amplitude of the resonance at F1 is larger than that at F3 and the amplitude difference between F2 and F4 will be even greater. Similarly, if the input resonator is driven by the synthesizer 122 and FB is lower in frequency than FA, then the amplitude of the resonance at F1 is lower than that at F3 and, depending on the crystal parameters and the value of capacitance in the measurement fixture 110, the amplitude of the resonance at F2 may or may not be lower than that at F4. Therefore, the two amplitudes at F1 and F3, as well as those at F2 and F4, should be kept within a range consistent with the sensitivity of phase detector 124 in order to detect the positive to negative zero crossings of the crystal response as the frequency from synthesizer 122 is increased. Thus, we have found it desirable to keep the frequencies FA and FB approximately equal to each other within practical limits, depending on the crystal design, during the frequency-coupling plating process.

Once the initial start coordinates are determined and SPSF[1], FA[1] and FB[1] are all within acceptable ranges such that they can be plated to their target values based on empirical data from the coupled-dual crystal design and the specific frequency plate masks used, the resonator with the initially higher frequency is plated first to bring its frequency slightly below the other resonator. If one resonator is initially substantially higher in frequency than the other (by 30 KHz, for example), it is automatically plated in convenient increments of a few kilohertz until the two resonators are approximately equal. Computer 120 calculates FA and FB from values of F1, F2, F3 and F4 received from phase detector 124 and automatically instructs the plating control module 130 to position shutters A1, A2 to expose the input and output resonators depending on the relative calculated values of FA and FB. It also activates the filament power supply 118 to the A side filament 114.

After plating the initially higher resonator, the resonators are plated alternatively, each to a value slightly below the other until the new value of plateback (PB[2]) is approximately 5 to 10% of the total plateback. The new values of SPSF[2] and PB[2] are obtained by the four-peak method and calculated by computer 120, and the slope α of line L, is obtained (FIG. 9). In actuality, as the input and output resonators are plated, all four peaks (F1, F2, F3, F4), or a subset thereof, may be used, depending upon the speed of computer 120, to monitor the plating process through frequencies FA and FB. Line L on FIG. 9 is extended mathematically by the computer to determine point 134 on FIG. 9 Thereafter, a new line L' of slope α is generated within computer 120 such that its plateback at point 136 is typically 20 to 80 percent of the total plateback down the vertical axis. Of course, once point (ΔSPSF[2], PB[2]) is obtained, shutter A1 is released by the A1 solenoid so that it is up into a position blocking further resonator plating (position 3, FIG. 12B). Next, the computer activates the filament power supply 118 to the B filament 116 and instructs the plating control interface module 130 to activate the B solenoid to open the B side shutter, thereby plating the coupling adjust spot on the ground side as previously discussed. Thus, SPSF is adjusted (it increases while plateback decreases along line 66 to point 138 (ΔSPSF[3], PB[3]) and the four frequencies (or a subset thereof) are used to monitor the movement. When point 138 is reached, the B solenoid is instructed by computer 120 to close the B side shutter to block further plating of the coupling adjust spot, while the filament power supply to filament 116 is turned off. If the resonator frequencies become unequal outside a specified range, due to misalignment of the coupling adjust spot mask, a computer subroutine is accessed to correct the frequency discrepancy by plating the higher of the two resonators as done previously.

When the first coupling adjust is complete (coordinates ΔSPSF[3]PB[3]), the input and output resonators are again alternately plated until 10 to 20 percent of the remaining plateback is obtained (coordinates ΔSPSF[4], PB[4]) and line L" with slope β is calculated by computer 120. Typically, this slope carries with it the effects of the mask's seating on the crystal. As a result, line L" is mathematically translated by the computer such that it passes through the origin. This line is designated L'". Now SPSF is adjusted by further plating the coupling adjust spot in the previous manner until point 140 is reached on line L'" via path 68. As SPSF is adjusted, FA and FB are continuously monitored by the computer 120 through phase detector 124 and plating control interface module 130 to assure that they are within a predetermined value of each other.

Thereafter, the input and output resonators are alternatively plated while the computer monitors the degree to which line L'" is followed to the origin. If it deviates more than a predetermined amount on the high side, a correction is made by readjusting SPSF by further plating of the coupling adjust spot. If line L'" intersects the vertical axis above the origin, a final SPSF adjust can be made prior to a final frequency adjust.

It should become obvious to one skilled in the art that certain changes can be made to the above described invention without departing from the broad inventive concepts thereof. For example, it may be possible to reverse the sequence of some of the steps previously described without materially altering the results. In addition, other monitoring techniques for determining FA, FB and coupling may be used within the spirit of the present invention. Further, the concept of applying the coupling adjust spot on the ground side applies equally whether or not the ground side electrodes are split as long as the area between the front side electrodes is shadowed as discussed herein. It is intended that the appended claims cover these and all other variations in the present inventions broader inventive concepts.

Having thus described the invention, what we claim as novel and desire to be secured by Letters Patent of the United States is:

1. In a method of manufacturing a coupled-dual resonator crystal having target values of mean frequency and synchronous peak separation frequency, the steps of plating electrode material onto opposite sides of a piezoelectric wafer to form a first pair of split electrodes on a front side of the wafer separated by an unelectroded region, and a second pair of split electrodes on the other, grounded side of the wafer 10 in superimposed relationship, opposed electrodes from each pair forming a pair of resonators having an initial mean frequency and sychronous peak separation frequency;

plating a coupling adjust spot on the grounded side of the wafer overlapping a portion of each of the second pair of electrodes while leaving a portion of each of the second pair of electrodes unplated, and shadowing the unelectroded region between the first pair of electrodes and a portion of each of the first pair of electrodes, to produce a change in the synchronous peak separation frequency; and plating a frequency plate spot on each electrode of the first pair to simultaneously adjust the mean frequency and synchronous peak separation frequency of the resonators.

2. In a method of manufacturing a coupled-dual resonator crystal having target values of mean frequency and synchronous peak separation frequency, the steps of:

plating electrode material onto opposite sides of a piezoelectric wafer to form a first pair of split electrodes on a front side of the wafer separated by an unelectroded region, and a second pair of split electrodes on the other, grounded side of the wafer in superimposed relationship, opposed electrodes from each pair forming a pair of resonators having an initial mean frequency and synchronous peak separation frequency;

plating a small amount of additional electrode material on the first pair of electrodes in order to determine the slope of a curve representing the relationship of change in mean frequency vs. change in synchronous peak separation frequency with increased plating of the first pair of electrodes;

plating a coupling adjust spot on the grounded side of the wafer overlapping a portion of each of the second pair of electrodes and shadowing the unelectroded region between the first pair of electrodes to produce a change in the synchronous peak separation frequency; and plating a frequency plate spot on each electrode of the first pair to simultaneously adjust the mean frequency and synchronous peak separation frequency of the resonators.

3. In the method of claim 2, plating the coupling adjust spot until synchronous peak separation frequency reaches a value which, upon further plating of the frequency adjust spots, will result in the crystal having substantially the target levels of mean frequency and synchronous peak separation frequency.

4. In the method of claim 1, plating the frequency plate spot onto each of the first pair of electrodes until the target levels of mean frequency and synchronous peak separation frequency are obtained.

5. In the method of claim 1, plating the frequency plate spot on each of the first pair of electrodes in accordance with a predetermined, substantially linear relationship of change in mean frequency and synchronous peak separation frequency with increased plating of the frequency adjust spots until the target levels of both parameters are obtained.

6. In a method of manufacturing a monolithic crystal filter, the steps of:
plating electrode material onto opposite sides of a piezoelectric wafer to form a first pair of electrodes on the front side of the wafer separated by an unelectroded region, and a second pair of split electrodes on the other, grounded side of the wafer in superimposed relationship to the first pair of electrodes, thereby forming a pair of resonators having an initial value of mean frequency and synchronous peak separation frequency;
selecting a mask for plating additional electrode material in the form of a frequency plate spot onto each of the first pair of electrodes, the selected mask producing changes in mean frequency and synchronous peak separation frequency as the electrodes are plated;
plating a coupling adjust spot on the grounded side of the wafer overlapping a portion of each of the second pair of electrodes and shadowing the unelectroded region between the first pair of electrodes to produce a change in synchronous peak separation frequency of an amount such that by further plating the frequency plate spots through the selected mask the target levels of mean frequency and synchronous peak separation frequency will be substantially obtained; and
plating additional electrode material on the frequency plate spots through the selected mask.

7. In the method of claim 6 wherein the selected mask is selected from a plurality of masks having different mean frequency vs. synchronous peak separation frequency characteristics when used to plate frequency plate spots on the first pair of electrodes.

8. In the method of claim 6 wherein the selected mask produces a generally linear change in mean frequency with change in synchronous peak separation frequency as the frequency plate spots are plated.

9. In the method of claim 6 the further step of:
plating a small amount of additional electrode material on the first pair of electrodes in order to predetermine the relationship between changes in mean frequency and synchronous peak separation frequency as the frequency plate spots are plated prior to plating the coupling adjust spot.

10. In the method of claim 6 wherein the coupling adjust spot also shadows each of the first pair of electrodes by approximately half the extent of the unelectroded region between the first pair of electrodes.

11. In the method of claim 10 wherein the coupling adjust spot also shadows the frequency plate spots by about 1 to 5 mils.

12. In a method of tuning a coupled-dual resonator crystal to target values of mean frequency and synchronous peak separation frequency, said crystal having a pair of resonators comprising a pair of electrodes on the front side of a piezoelectric wafer and separated by an unelectroded region, and a second pair of split electrodes on the other side of the wafer in superimposed relationship to the first pair of electrodes, the steps of:
plating a coupling adjust spot over each of a portion of the second pair of electrodes and shadowing the unelectroded region between the first pair of electrodes to increase the synchronous peak separation frequency of the resonators; and
plating frequency plate spots on the first pair of electrodes to simultaneously change both the mean frequency and synchronous peak separation frequency until the target levels of both parameters are substantially achieved.

13. The method of claim 12 further comprising the step of plating a small amount of additional electrode material on the first pair of electrodes prior to plating the coupling adjust spot in order to determine the relationship of mean frequency vs. synchronous peak separation frequency with increased plating.

14. In a method of tuning a coupled-dual resonator crystal to target values of mean frequency and synchronous peak separation frequency, said crystal having a pair of resonators comprising a pair of electrodes on the front side of a piezoelectric wafer and separated by an unelectroded region, and a second pair of split electrodes on the other side of the wafer in superimposed relationship to the first pair of electrodes, the steps of:
plating a coupling adjust spot over each of a portion of the second pair of electrodes and shadowing the unelectroded region between the first pair of electrodes to increase the synchronous peak separation frequency of the resonators; and
plating frequency plate spots on the first pair of electrodes;
wherein the amount of material plated on the coupling adjust spot and the frequency plate spots results in changes in mean frequency and synchronous peak separation frequency until the target levels of both parameters are substantially achieved.

15. In a method of tuning a coupled-dual resonator crystal to target values of mean frequency and synchronous peak separation frequency, said crystal having a pair of resonators comprising a pair of electrodes on the front side of a piezoelectric wafer and separated by an unelectroded region, and a second pair of split electrodes on the grounded side of the wafer in superimposed relationship to the first pair of electrodes, said resonators having initial values of mean frequency and synchronous peak separation frequency, the steps of:
applying a known variable frequency signal to one of said resonators;
determining the resonant frequencies of both resonators in response to said applied signal;
plating the resonator with the higher resonant frequency with a frequency plate spot to bring its resonant frequency slightly below the other resonator;
alternatively plating both resonators with frequency plate spots to change the initial values of both the mean frequency and synchronous peak separation frequency;
calculating the initial relationship of change in mean frequency vs. change in synchronous peak separation frequency as the frequency plate spots are plated;
plating a coupling adjust spot on the grounded side of the wafer overlapping a portion of each of the second pair of electrodes and shadowing the unelectroded region between the first pair of electrodes to increase synchronous peak separation frequency and decrease mean frequency; and further plating said frequency plate spots to obtain the target values of mean frequency and synchronous peak separation frequency.

16. The method of claim 15 wherein said frequency plate spots are plated only until the change in mean frequency from its initial value is approximately 5 to 10 percent of the required change to the target value prior to calculating the relationship of change in mean frequency to change in synchronous peak separation frequency.

17. The method of claim 16 further comprising the step of verifying the initial relationship of change in mean frequency vs. change in synchronous peak separation frequency prior to plating said frequency plate spots to the target values and further plating the coupling adjust spot to compensate for any change in the initial relationship.

18. In a method of tuning a coupled dual-resonator crystal to target values of mean frequency and synchronous peak separation frequency, said crystal comprising a piezoelectric wafer having electrodes plated on opposite sides thereof which, in cooperation with the piezoelectric wafer, form a pair of resonators, a first side of the wafer having two such electrodes disposed thereon and separated by an unelectroded region and a second side of the wafer having at least one electrode disposed thereon, the steps of:

plating a coupling adjust spot on the second side of the wafer in alignment with the unelectroded region and shadowing only a portion of each of said electrodes on the first side to thereby increase the synchronous peak separation frequency of the resonators and;

plating frequency plate spots on electrodes associated with each of said resonators to simultaneously change both frequency and synchronous peak separation frequency to substantially their target values.

19. The method of claim 18 wherein the second side of said wafer has a pair of split electrodes disposed thereon.

20. The method of claim 18 wherein the second side of said wafer has a single electrode thereon shadowing at least a portion of each of said electrodes on the first side of said wafer.

21. The method of claim 19 wherein said coupling adjust spot is plated on the second side of said wafer overlapping a portion of each of said split electrodes and shadowing the unelectroded region on the first side of said wafer.

22. The method of claim 19 wherein said second side split electrodes are grounded.

* * * * *